United States Patent
Nakamura et al.

[11] Patent Number: 5,925,899
[45] Date of Patent: Jul. 20, 1999

[54] VERTICAL TYPE INSULATED GATE BIPOLAR TRANSISTOR HAVING A PLANAR GATE STRUCTURE

[75] Inventors: Hideki Nakamura; Tadaharu Minato, both of Hyogo, Japan

[73] Assignee: Mitsubishi Denki Kabushiki Kaisha, Tokyo, Japan

[21] Appl. No.: 08/977,667

[22] Filed: Nov. 24, 1997

[30] Foreign Application Priority Data

May 27, 1997 [JP] Japan ................................. 9-136955

[51] Int. Cl.$^6$ ............................. H01L 29/74; H01L 31/111
[52] U.S. Cl. ........................... 257/133; 257/137; 257/146; 257/154; 257/378; 257/379; 438/135; 438/234
[58] Field of Search ................................. 257/133, 137, 257/146, 154, 378, 379; 438/135, 234

[56] References Cited

U.S. PATENT DOCUMENTS 4,985,743  1/1991  Tokura et al. .

5,773,851  6/1998  Nakamura et al. ............... 257/133

FOREIGN PATENT DOCUMENTS

| 0399530 A1 | 11/1990 | European Pat. Off. . |
| 0633611 A1 | 1/1995 | European Pat. Off. . |
| 0656661 A1 | 6/1995 | European Pat. Off. . |
| 3824836 A1 | 2/1989 | Germany . |
| 1-198076 | 8/1989 | Japan . |
| 3-289176 | 12/1991 | Japan . |
| 6-232392 | 8/1994 | Japan . |

Primary Examiner—Ngân V. Ngô
Attorney, Agent, or Firm—McDermott, Will & Emery

[57] ABSTRACT

A first metal electrode layer is formed to be electrically connected with a p base region formed in an n drift region. A second metal electrode layer which is electrically connected with an emitter region provided in the p base region is formed. A direct current power supply unit is provided to be electrically connected with the first and second metal electrode layers. The direct current power supply unit functions as means for applying forward bias to a pn junction between the n emitter region and the p base region.

9 Claims, 9 Drawing Sheets

VERTICAL TYPE INSULATED GATE BIPOLAR TRANSISTOR HAVING A PLANAR GATE STRUCTURE

BACKGROUND OF THE INVENTION

1. Field of the Invention

The present invention relates to a semiconductor device and a method of manufacturing the same, and more particularly relates to a vertical type Insulated Gate Bipolar Transistor (hereinafter referred to simply as "IGBT") having a planar gate structure.

2. Description of the Background Art

Generally, IGBT has been utilized widely as an element for controlling a motor or for switching an inverter or the like. IGBT is a voltage drive element having both of a low saturation voltage property of the bipolar transistor and a high speed switching property of the MOSFET. IGBT is characterized by that the loss of driving power and the loss at ON/OFF switching are small. Recently, IGBT has been used widely since it has a device structure to allow ON voltage to be reduced by miniaturizing MOSFET formed at the chip surface and improving the degree of integration of MOSFET.

A vertical type IGBT having a planar gate structure is mentioned here as one example of a conventional IGBT, and the structure thereof is hereinafter described. FIG. 15 is a cross sectional view showing an n channel IGBT having a conventional planar gate structure.

With reference to FIG. 15, an n drift region 1 is formed at a side of a first main surface 14a of a semiconductor substrate 14, and a p base region 2 is selectively formed in n drift region 1. An n emitter region 3 is selectively formed in p base region 2. A region which is sandwiched between n drift region 1 and n emitter region 3, located within p base region 2, and reaches the first main surface 14a is referred to as a channel formation region 4. A gate dielectric layer 5 is formed on the first main surface 14a to cover channel formation region 4. Gate dielectric layer 5 extends from a portion over n emitter region 3 to a portion over n drift region 1.

P base region 2 and n emitter region 3 are short-circuited by a metal electrode layer (emitter electrode) 8. P base region 2 and metal electrode layer 8 as well as n emitter region 3 and metal electrode layer 8 are in ohmic contact with each other. A p collector region 10 is formed at a side of a second main surface 14b of semiconductor substrate 14. A metal electrode layer (collector electrode) 11 is formed on the second main surface 14b so that metal electrode layer 11 is in ohmic contact with p collector region 10.

An operation of an n channel IGBT having the above structure is described. Four processes, specifically a transient process from a cut-off (OFF) state to a conduction (ON) state, a steady state, a transient process from the ON state to the OFF state, are respectively described below.

(1) Transient process from OFF state to ON state

Positive (+) voltage is applied to gate electrode 6 while voltage which is relatively positive to the voltage at emitter electrode 8 is applied to collector electrode 11. Accordingly, a channel inverted to become n type is formed at channel formation region 4 located in p base region 2. Through this n channel, the electron as one of the carriers is injected from n emitter region 3 into n drift region 1, and the electron flows toward p collector region 10. When the electron reaches p collector region 10, the hole as one of carriers is injected from p collector region 10 into n drift region 1. The hole flows toward n emitter region 3 to which relatively negative voltage is applied, and the hole reaches a place where the n channel contacts with n drift region 1. This process is referred to as a storage process, and the time required for this process is referred to as a turn-on delay time (td (on)). The loss of electric power in this process is extremely small and negligible.

Enough carriers are thereafter stored according to the potential applied between emitter electrode 8 and collector electrode 11, and a low-resistance state referred to as conductivity modulation due to a pair of electron-hole occurs. Accordingly, the turn-on operation completes. This process is called a rise process, and the time required for this process is called rise time (t(rise)). The loss of electric power in this process is relatively large.

(2) Steady state

The steady state after completion of the turn-on operation is called ON state, and the voltage when current of 100A/$cm^2$ flows is called ON voltage. The power loss in this state is called ON loss or steady loss, and expressed by the product of forward voltage drop caused by a resistance component and conducting current. The power loss in ON state is generally exceedingly large. The resistance component in the ON state is determined by the sum of respective resistance components existing at the current path of the device or between emitter electrode 8 and collector electrode 11. The current path of the device is added to the cross sectional view of IGBT in FIG. 15 and shown in FIG. 16 together.

Referring to FIG. 16, C, E and G in this figure respectively represent terminals of electrodes of the collector, emitter, and gate. Further, Ic, Ih, and Ie respectively represent collector current of IGBT, hole current flowing from n drift region 1 into p base region 2, and electron current flowing from n drift region 1 into n emitter region 3 through channel formation region 4. As shown in FIG. 16, the total resistance component R affecting the ON voltage can be expressed by the following equation.

$$R = Rcn + Rn + Rch + Ra + R_{JFET} + Rd + Rdiode + Rs + Rcp$$

In the equation above, Rcn is contact resistance between n emitter region 3 and metal electrode layer 8, Rn is resistance of n emitter region 3, Rch is resistance of the channel, Ra is resistance of the storage layer, $R_{JFET}$ is a resistance component due to JEFT (Junction-FET) effect, Rd is resistance of n drift region 1, Rdiode is forward voltage drop of the diode between p collector region 10 and n drift region 1, Rs is resistance of p collector region 10, and Rcp is the contact resistance between p collector region 10 and metal electrode layer 11.

(3) Transient process from ON state to OFF state

OFF state is caused by applying a voltage of at most the threshold voltage such as negative (−) voltage to gate electrode 6. When the potential at gate electrode 6 is the threshold voltage or less, the n channel formed in ON state disappears. Accordingly, supply of electrons from n emitter region 3 to n drift region 1 is stopped. This process is referred to as a storage process, and the time required for this process is called storage time or turn off delay time (td (OFF)). The power loss during this process is extremely small and negligible. Since the supply of electrons is stopped, the density of electrons gradually decreases from a region in the vicinity of n emitter region 3. Accordingly, the holes injected into n drift region 1 for maintaining an electrically neutral condition also decreases.

Since p base region 2 and n drift region 1 are in a reverse bias state, a depletion layer begins to expand at an interface between p base region 2 and n drift region 1. The depletion layer has a thickness corresponding to a voltage applied between collector electrode 11 and emitter electrode 8. This process is called fall process, the time required for this process is called fall time, and the power loss during this process is called fall loss. The power loss during this period is equivalent to or larger than the turn on loss and the steady state loss. Holes among carriers outside the depletion region pass through the depletion region, pass through a $p^+$ contact region having high concentration in p base region 2 which is electrically short-circuited with n emitter region, and reach emitter electrode layer 8. All of the carriers thus disappear and the turn-off complete. This process is called a tail process, the time required for this process is called tail time (t (tail)), and the power loss in these process is called tail loss. The power loss during this process is extremely large.

(4) OFF state

The steady state after completion of the turn-off is referred to as OFF state. The power loss expressed by the product of the leakage current in this state and the voltage between collector electrode 11 and emitter electrode 8 is extremely small compared with other power losses, and is negligible.

Various power losses occur in respective processes of conduction/cut-off in the conventional IGBT as described above. In order to achieve a high performance of IGBT, reduction of any one of these losses is desired. Inventors of this application turn the attention to the power loss in the ON state having an extremely large value compared with other losses. It is enough to decrease ON voltage to reduce the power loss in ON state.

In the conventional planar gate type IGBT shown in FIG. 15, ON voltage can be somewhat reduced by scaling down IGBT. The reason is that each component of IGBT is reduced mainly in lateral direction with respect to FIG. 16 by the scaling down, resulting in reduction of the resistance component. However, the scaling down is limited and sufficient reduction of ON voltage is difficult.

Another method of reducing ON voltage is to decrease the concentration of p base region 2. However, the latch-up phenomenon could occur by the reduction of the concentration of p base region 2. When the latch-up phenomenon happens, electrons are directly injected from n emitter region 3 into p base region 2 if the voltage drop when hole current Ih flows from n drift region 1 to p base region 2 exceeds the built-in voltage of the npn bipolar transistor constituted by n emitter region 3, p base region 2 and n drift region 1. Once the latch-up occurs, the current flowing through IGBT due to the voltage applied to gate electrode 6 cannot be controlled and IGBT could be damaged.

SUMMARY OF THE INVENTION

Reduction of ON voltage without causing the latch-up phenomenon is difficult in the conventional semiconductor device as described above. The present invention is made to solve this problem. An object of the invention is to provide a semiconductor device and a method of manufacturing the same which enable ON voltage to be effectively reduced without causing the latch-up.

A semiconductor device according to the invention has a structure in which first and second main surfaces opposite to each other are provided and the current flowing between the first and second main surfaces is conducted/shut off. The semiconductor device according to the invention includes: a semiconductor substrate having first and second main surfaces; a first impurity region of a first conductivity type (e.g. n type); a second impurity region of a second conductivity type (e.g. p type); a third impurity region of the first conductivity type; a channel formation region; a gate dielectric layer; a gate electrode; forward bias means; and a fourth impurity region of the second conductivity type. The first impurity region is formed to extend from the first main surface into the semiconductor substrate. The second impurity region is formed to extend from the first main surface into the first impurity region. The third impurity region is formed to extend from the first main surface into the second impurity region. The channel formation region is located in the second impurity region and reaches the first main surface. The gate dielectric layer is formed on the first main surface to cover the channel formation region. The gate electrode has a portion opposite to the channel formation region with the gate dielectric layer therebetween. The forward bias means apply forward bias to the pn junction between the second and third impurity regions during conduction. The fourth impurity region is formed to extend from the second main surface into the semiconductor substrate.

The forward bias means provided for the semiconductor device according to the invention allow forward bias to be applied to the pn junction between the second and third impurity regions during conduction. Accordingly, the potential of the second impurity region can be increased, and injection of electrons from the third impurity region into the second impurity region can be promoted. The increased potential of the second impurity region also increases the potential of the pn junction between the first and second impurity regions. Further, injection of holes from the fourth impurity region into the second impurity region through the first impurity region can be promoted. As a result, concentration of the carriers in the first and second impurity regions can be increased. The resistance of the semiconductor device during conduction can thus be reduced, thereby reducing ON voltage of the semiconductor device.

Preferably, the voltage applied to the pn junction between the second and third impurity regions by the forward bias means is smaller than the built-in voltage of the pn junction.

If the voltage applied to the pn junction between the second and third impurity regions by the forward bias means is smaller than the built-in voltage of the pn junction, the latch-up can be prevented effectively.

The semiconductor device according to the invention may further include a first electrode layer, a second electrode layer, a direct current source, and a third electrode layer. The first electrode layer is electrically connected with the second impurity region, and formed on the first main surface of the semiconductor substrate. The second electrode layer is electrically connected with the third impurity region, and formed on the first main surface of the semiconductor substrate. The direct current source is electrically connected with the first and second electrode layers, functions as the forward bias means, and keeps the potential of the second impurity region relatively higher than the potential of the third impurity region. The third electrode layer is electrically connected with the fourth impurity region and formed on the second main surface.

If the first electrode layer electrically connected with the second impurity region as well as the second electrode layer electrically connected with the third impurity region are formed and a direct current power supply unit electrically connected with the first and second electrode layers are provided, the direct current power supply unit can be used as the forward bias means described above. Accordingly, ON voltage can be reduced.

Preferably, the first electrode layer is constituted by a metal layer formed to be in ohmic contact with the surface of the second impurity region. The second electrode layer is preferably constituted by a metal layer formed to be in ohmic contact with the surface of the third impurity region. Between the first and second electrode layers, preferably a dielectric layer is formed to extend from a portion over the first main surface.

When a dielectric layer is provided between the first and second electrode layers, the first and second electrode layers can be separated by insulation. As a result, the potential of the second impurity region can be increased using the direct current power supply unit, thereby reducing ON voltage of the semiconductor device.

The semiconductor device according to the invention may further include first and second electrode layers and voltage drop means. The first electrode layer is electrically connected with the second impurity region and formed on the first main surface. The voltage drop means function as the forward bias means and placed between the first electrode layer and the second impurity region. The second electrode layer is electrically connected with the fourth impurity region and formed on the second main surface.

If the voltage drop means is provided between the first electrode layer and the second impurity region, voltage drop occurs when current flows through a portion including this voltage drop means during conduction of the semiconductor device. The potential of the second impurity region can be increased to a value higher than that of the third impurity region, and injection of electrons from the third impurity region into the second impurity region can be promoted. Further, injection of holes into the second impurity region can be promoted thereby increasing concentration of carriers within the first and second impurity regions. As a result, the resistance of the semiconductor device during conduction can be reduced and ON voltage of the semiconductor device can be decreased.

A resistance layer having a resistance value higher than a sheet resistance value of the second impurity region may be employed as the voltage drop means.

A Schottky junction region may be formed between the second impurity region and the first electrode layer as the voltage drop means.

A resistance layer having a resistance value higher than a sheet resistance value of the second impurity region, or a Schottky junction region may be employed as the voltage drop means as described above. By providing the resistance layer or the Schottky junction region, ON voltage of the semiconductor device can be reduced while the latch-up is controlled.

The present invention provides a method of manufacturing a semiconductor device which has a structure in which first and second main surfaces opposite to each other are provided and current is conducted/shut off between the first and second main surfaces. The method of manufacturing a semiconductor device according to one aspect of the invention includes following steps. A semiconductor substrate having first and second main surfaces are provided. A first impurity region of a first conductivity type is formed to extend from the first main surface into the semiconductor substrate. A second impurity region of a second conductivity type is formed to extend from the first main surface into the first impurity region. A third impurity region of the first conductivity type is formed to extend from the first main surface into the second impurity region. A fourth impurity region of the second conductivity type is provided to extend from the second main surface into the semiconductor substrate. A gate dielectric layer is formed to cover a channel formation region which is located in the second impurity region and reaches the first main surface. A gate electrode having a portion opposite to the channel formation region with the gate dielectric layer therebetween is provided. A first electrode layer is formed on the first main surface to be electrically connected with the second impurity region. The surface of the third impurity region is exposed by patterning the first electrode layer. A dielectric layer is provided to cover the patterned first electrode layer. A second electrode layer is formed on the dielectric layer and on the surface of the third impurity region. A third electrode layer is formed on the surface of the fourth impurity region. A direct current power supply unit is provided to be electrically connected with the first and second electrode layers.

In the method of manufacturing the semiconductor device according to one aspect of the invention, the first and second electrode layers are formed in separate steps, and the dielectric layer is provided therebetween. The direct current power supply unit can be placed to be electrically connected with the first and second electrode layers. Accordingly, a semiconductor device in which the latch-up is avoided and ON voltage can be reduced is obtained.

In a method of manufacturing a semiconductor device according to another aspect of the invention, following steps are carried out. A semiconductor substrate having first and second main surfaces are provided. A first impurity region of a first conductivity type is formed to extend from the first main surface into the semiconductor substrate. A second impurity region of a second conductivity type is formed to extend from the first main surface into the first impurity region. A third impurity region of the first conductivity type is provided to extend from the first main surface into the second impurity region. A fourth impurity region of the second conductivity type is provided to extend from the second main surface into the semiconductor substrate. A gate dielectric layer is formed to cover a channel formation region which is located within the second impurity region and which reaches the first main surface. A gate electrode having a portion opposite to the channel formation region with the gate dielectric layer therebetween is formed. A voltage drop portion is provided at the surface of the second impurity region for causing voltage drop. A first electrode layer is formed to extend from a portion on a surface of the third impurity region to a portion on the voltage drop portion. A second electrode layer is formed on the surface of the fourth impurity region.

In the method of manufacturing a semiconductor device according to another aspect of the invention described above, the voltage drop portion is provided at the surface of the second impurity region. A polysilicon layer containing impurities of low concentration or a Schottky junction region may be employed as the voltage drop portion. By providing such a voltage drop portion, a semiconductor device in which reduction of ON voltage is possible can be obtained. Since formation of the first and second electrode layers on the first main surface in separate steps is unnecessary as required in the method according to the first aspect of the invention, the process can be simplified compared with that according to the first aspect of the invention.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention are hereinafter described referring to FIGS. 1–14.

(First Embodiment)

Figure 1:
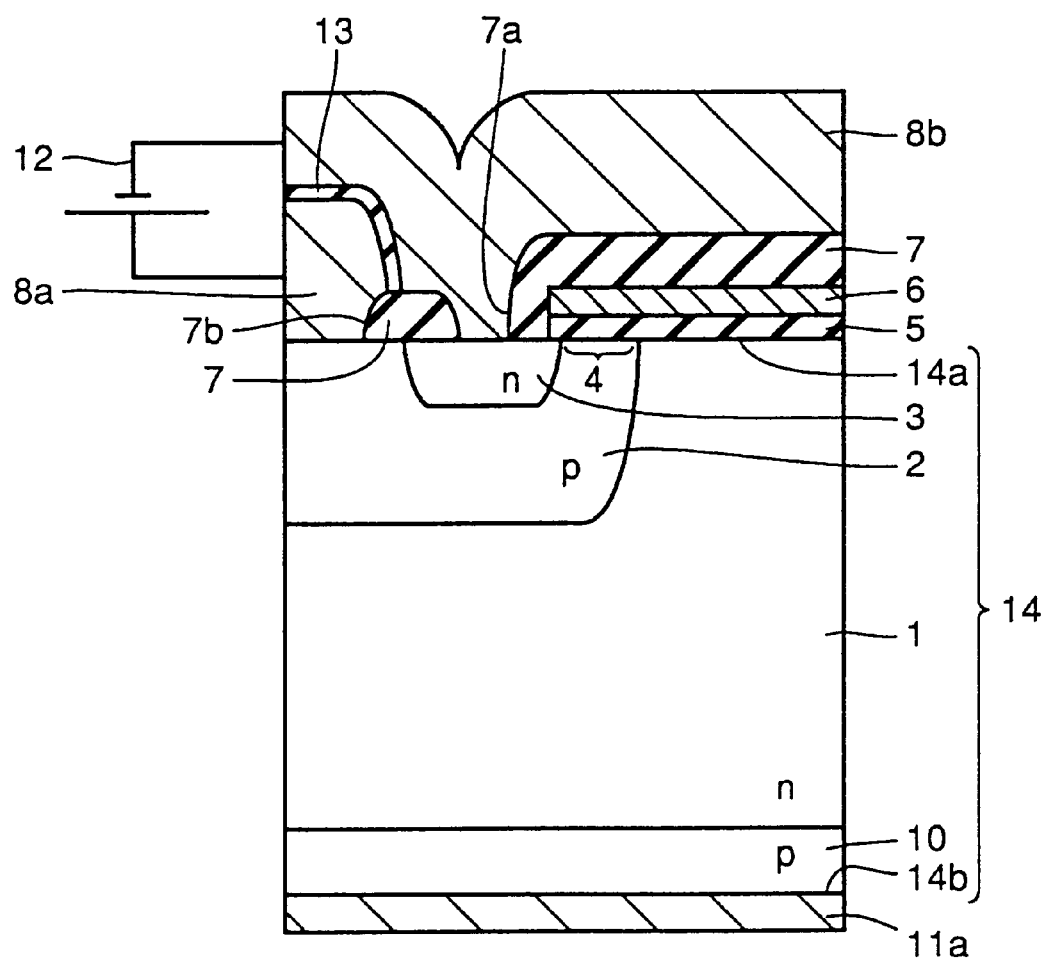
FIG. 1 is a cross sectional view showing an n channel IGBT having a planar gate structure according to the first embodiment of the invention.

With reference to FIGS. 1–10, description of the first embodiment of the invention is given. FIG. 1 is a cross section showing an n channel IGBT having a planar gate structure according to the first embodiment.

With reference to FIG. 1, an n drift region 1 is provided at a side of a first main surface 14a of a semiconductor substrate 14. Semiconductor substrate 14 may be a substrate of an intrinsic semiconductor, or may be constituted by a plurality of semiconductor layers. A p base region 2 is formed to extend from the first main surface 14a of semiconductor substrate 14 into n drift region 1. P base region 2 is selectively formed in n drift region 1. N drift region 1 has a portion which reaches the first main surface 14a.

An n emitter region 3 is formed to extend from the first main surface 14a into p base region 2. N emitter region 3 is selectively formed in p base region 2. A region which is sandwiched between n drift region 1 and n emitter region 3 and includes a part of the first main surface 14a in p base region 2 is hereinafter referred to as a channel formation region 4. A gate dielectric layer 5 is provided to cover the first main surface 14a on channel formation region 4 and to contact with both of n drift region 1 and n emitter region 3. Gate dielectric layer 5 is constituted by, for example, a dielectric layer such as a silicon oxide film. A p collector region 10 is formed to extend from a second main surface 14b into semiconductor substrate 14.

A gate electrode 6 is formed on gate dielectric layer 5 to have a portion opposite to channel formation region 4 with gate dielectric layer 5 therebetween. Gate electrode 6 is constituted by, for example, polysilicon doped with phosphorus.

A dielectric layer 7 is formed on the first main surface 14a to cover gate electrode 6. A contact hole 7a which exposes all of or part of the surface of n emitter region 3 as well as a contact hole 7b which exposes a part of p base region 2 are provided at dielectric layer 7. A first metal electrode 8a is formed to extend from contact hole 7b onto dielectric layer 7. An interlayer dielectric layer 13 is provided to cover the first metal electrode layer 8a.

A second metal electrode layer 8b is formed to extend from contact hole 7a onto dielectric layer 7 and interlayer dielectric layer 13. The first metal electrode layer 8a is in ohmic contact with p base region 2, and the second metal electrode layer 8b is in ohmic contact with n emitter region 3. On the other hand, a third metal electrode layer 11a is formed on the second main surface 14b to be in ohmic contact with p collector region 10.

A direct current power supply unit 12 which functions as forward bias means is provided so that the unit is electrically connected with the first and second metal electrode layers 8a and 8b. The positive electrode side of direct current power supply unit 12 is connected to the first metal electrode layer 8a, and the negative side thereof is connected to the second metal electrode layer 8b. Interlayer dielectric layer 13 separates the first and second metal electrode layers 8a and 8b by insulation. Accordingly, a potential difference of a desired value between n emitter region 3 connected to the second metal electrode layer 8b and p base region 2 connected to the first metal electrode layer 8a can be obtained. At this time, a potential difference of at most the built-in voltage is generated at the pn junction between n emitter region 3 and p base region 2. As a result, forward bias can be applied to the pn junction between n emitter region 3 and p base region 2 during conduction. The potential of p base region 2 can be increased and injection of electrons from n emitter region 3 into p base region 2 can be promoted. Further, the potential of the pn junction between n drift region 1 and p base region 2 can be increased by increasing the potential of p base region 2. Injection of holes from p collector region 10 to p base region 2 through n drift region 1 can be promoted. The carrier concentration in n drift region 1 and p base region 2 can be increased. As a result, the resistance of IGBT during conduction can be decreased, and ON voltage of IGBT can be reduced. Further, if the voltage applied to the pn junction between p base region 2 and n emitter region 3 is smaller than the built in voltage of the pn junction, the latch-up can be avoided effectively. ON voltage of IGBT can thus be reduced without causing the latch-up.

Figure 2:
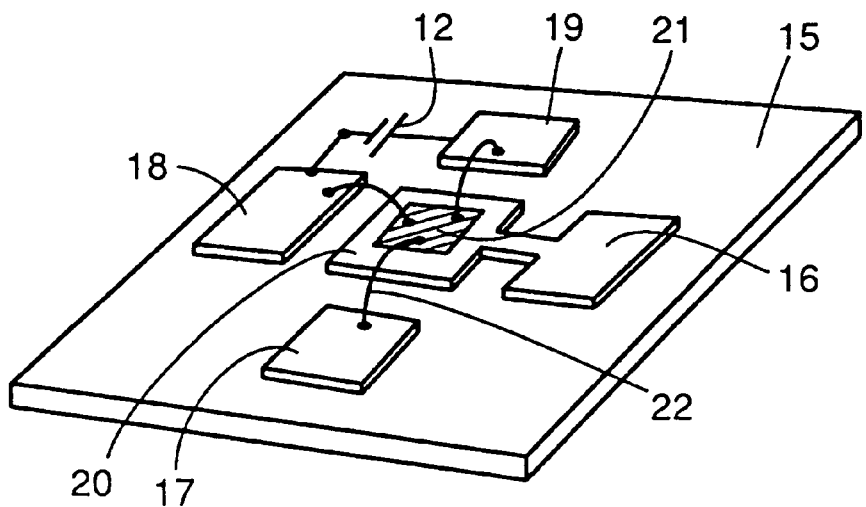
FIG. 2 is a perspective view of the direct current power supply unit according to the first embodiment provided as one example.

Referring to FIG. 2, a specific method of placing direct current power supply source 12 is described. FIG. 2 is a perspective view of direct current power supply unit 12 showing one example of the method of providing the unit.

Referring to FIG. 2, metal electrode plates 16, 17, 18, 19 and 20 are respectively attached to an insulating substrate 15 formed of ceramics or the like. Metal electrode plate 20 and metal electrode plate 16 are electrically connected, and IGBT 21 as described above is coupled to metal electrode plate 20 with its third metal electrode layer 11a facing downward. Metal electrode plate 16 is then electrically connected with p collector region 10 of IGBT 21. Metal electrode plate 17 is electrically connected with gate electrode 6 of IGBT 21 via a bonding wire 22. Metal electrode plate 19 is electrically connected with the first metal electrode layer 8a via bonding wire 22. Metal electrode plate 18 is connected with the second metal electrode layer 8b by bonding wire 22. Direct current power supply unit 12 is placed on insulating substrate 15 to be electrically connected with metal electrode plates 18 and 19.

Referring to FIGS. 3–11 next, a method of manufacturing the n channel IGBT having planar gate structure shown in FIG. 1 is described. FIGS. 3–10 are cross sections illustrating the first to the eighth steps of the manufacturing process of the planar gate structure n channel IGBT.

Figure 3:
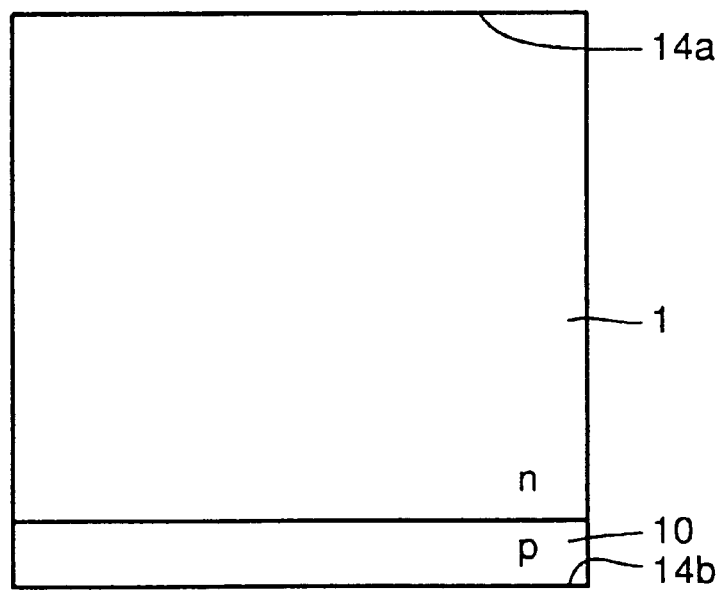
FIGS. 3–10 are cross sectional views respectively showing the first to the eighth steps of manufacturing IGBT shown in FIG. 1.
Figure 4:
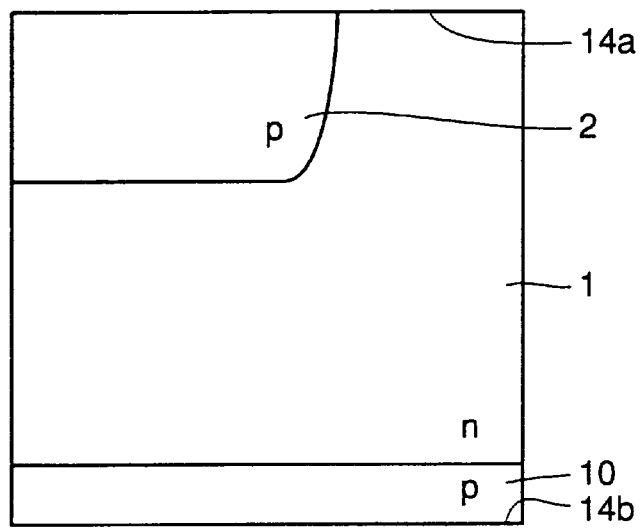
Figure 5:
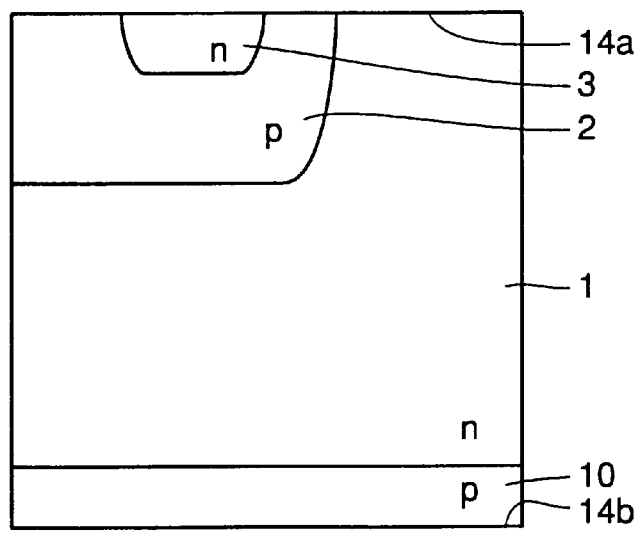

With reference to FIGS. 3–5, n drift region 1, p base region 2, and n emitter region 3 are respectively formed at a side of the first main surface 14a of substrate 14, and p collector region 10 is formed at a side of the second main surface 14b of substrate 14 by the ion implantation and thermal diffusion methods.

Figure 6:
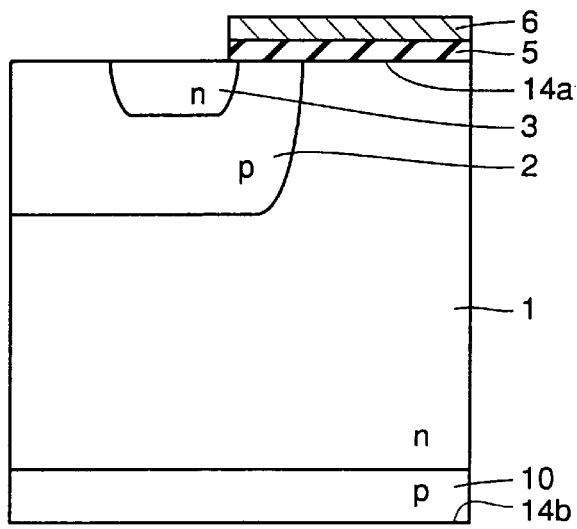

Referring to FIG. 6, a dielectric layer is formed on the first main surface 14a using the thermal oxidation method or the like. The dielectric layer is formed to extend over both of n drift region 1 and n emitter region 3. On the dielectric layer, a polysilicon layer doped with phosphorus is deposited using the CVD (Chemical Vapor Deposition) method or the like. By patterning the polysilicon layer and the dielectric layer, gate dielectric layer 5 and gate electrode 6 are provided.

Figure 7:
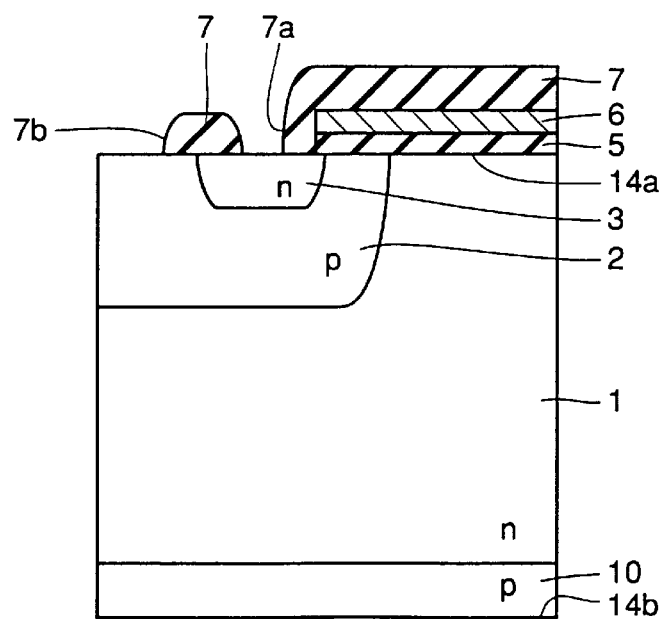

Referring to FIG. 7, dielectric layer 7 is formed on the first main surface 14a to cover gate electrode 6 using the CVD method or the like. Contact hole 7a which exposes at least a part of the surface of n emitter region 3 as well as contact hole 7b which exposes a part of the surface of p base region 2 are respectively formed by etching dielectric layer 7. An opening may be provided at dielectric layer 7 for forming a conductive layer electrically connected to gate electrode 6.

Figure 8:
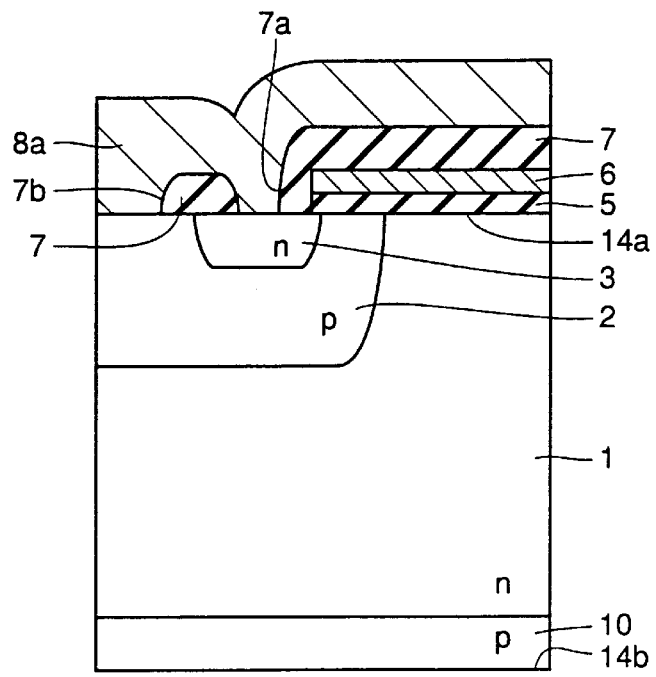
Figure 9:
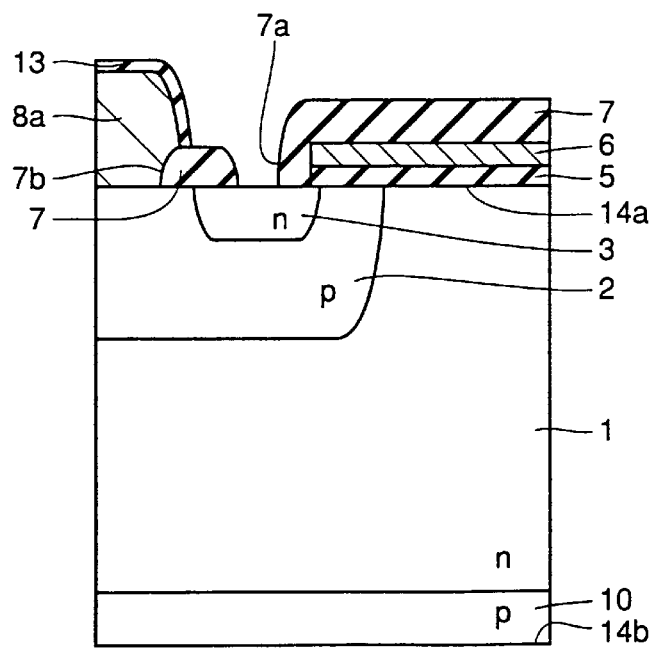

With reference to FIG. 8, the first metal electrode layer 8a is provided to extend from contact hole 7b onto dielectric layer 7. Next with reference to FIG. 9, after patterning the first metal electrode layer 8a by selectively etching it, interlayer dielectric layer 13 is formed. Interlayer dielectric layer 13 is patterned by selectively etching it. At least a part of the surface of n emitter region 3 is thus exposed.

Figure 10:
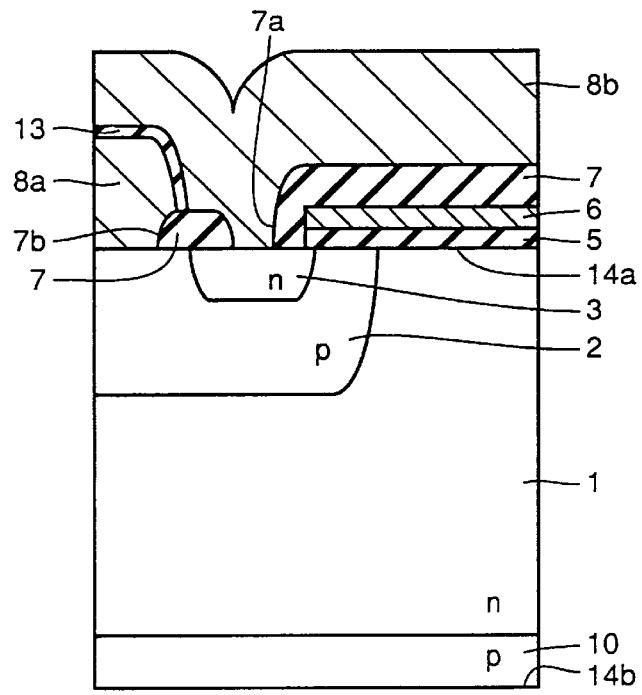

Referring to FIG. 10, the second metal electrode 8b is formed to extend from contact hole 7a onto interlayer dielectric layer 13. The second metal electrode layer 8b is patterned in a direction perpendicular to a plane of this document. The first and the second metal electrode layers 8a and 8b are separately formed.

The third metal electrode layer 11a is formed on the second main surface 14b to be in ohmic contact with the surface of p collector region 10. Direct current power supply unit 12 is placed which is electrically connected with the first and second metal electrode layers 8a and 8b. Through the steps described above, the IGBT having a planar gate structure shown in FIG. 1 is produced.

(Second Embodiment)

Figure 11:
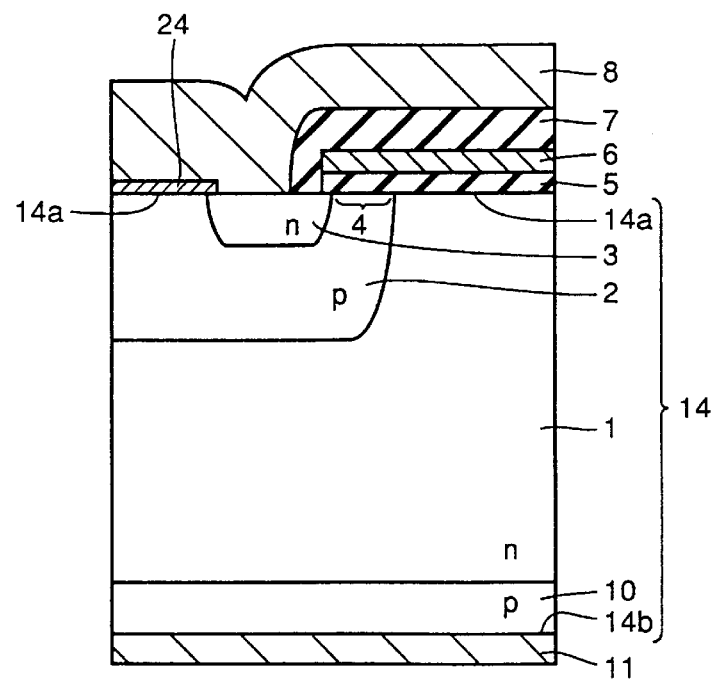
FIG. 11 is a cross section showing an n channel IGBT having a planar gate structure according to the second embodiment of the invention.
Figure 12:
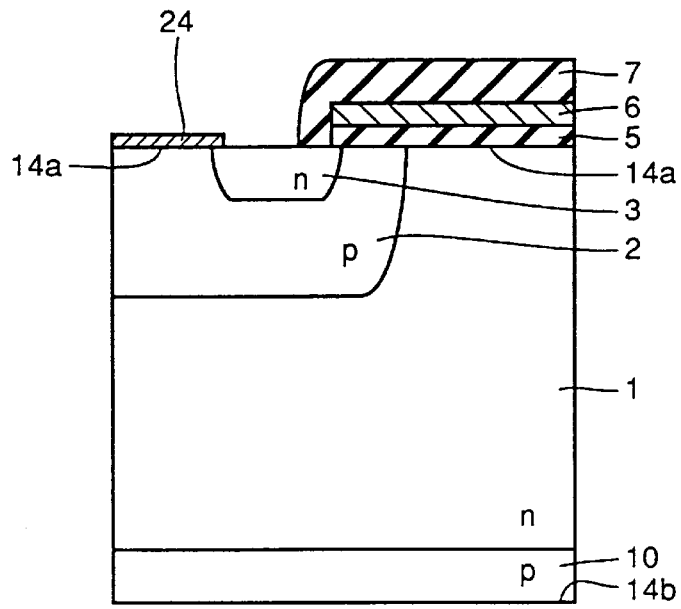
FIG. 12 is a cross sectional view of IGBT shown in FIG. 11 showing a characteristic process of manufacturing IGBT.

Referring to FIGS. 11 and 12, the second embodiment of the invention is described. FIG. 11 shows a cross section of an IGBT according to the second embodiment of the invention.

With reference to FIG. 11, according to the second embodiment, a resistive layer 24 is formed on the surface of p base region 2. Resistive layer 24 is constituted by non-doped polysilicon or polysilicon doped with phosphorus of low concentration. A resistance of resistive layer 24 is preferably determined such that it has a value higher than the sheet resistance value of p base region 2. Metal electrode layer 8 is formed on the first main surface 14a to cover resistive layer 24. Metal electrode layer 8 is in ohmic contact with n emitter region 3, and electrically connected with p base region 2 via resistive layer 24. Further structures are almost similar to those according to the first embodiment.

Provision of resistive layer 24 causes voltage drop when current passes through resistive layer 24 during conduction of IGBT. Accordingly, the potential of p base region 2 can be made higher than that of n emitter region 3, and forward bias can be applied to the pn junction between p base region 2 and n emitter region 3. As a result, injection of electrons from n emitter region 3 into p base region 2 can be promoted. Further, injection of holes into p base region 2 can be promoted thereby increasing the carrier density in n drift region 1 and p base region 2. The resistance of IGBT during conduction can be reduced, and ON voltage of IGBT can be reduced.

Specifically, if current having its density of 100A/cm$^2$ flows through a cell of 5 $\mu$m×5 $\mu$m in size, ON voltage can be improved by approximately 0.17 V at most by setting the resistance value of resistive layer 24 at approximately 2×10$^3$ ($\Omega$) to 2×10$^5$($\Omega$).

The reason is given below. Current of 2.5×10$^{-5}$A obtained by the following equation (1) flows through the cell above.

$$100\times(5\times10^{-4})\times(5\times10^{-4})=2.5\times10^{-5}(A) \quad (1)$$

When the amount of the maximum voltage drop is set at 0.5V, resistance value R can be obtained by the following equation (2).

$$R = \frac{0.5}{2.5} \times 10^5 = 2 \times 10^4 (\Omega) \quad (2)$$

Since the hole current in the ON state is one third of the electron current, ON voltage can be improved by a value obtained by the following equation (3).

$$2.5\times 10^{-5} \times 2\times 10^4 \times \frac{1}{3} = 0.17(V) \quad (3)$$

Accordingly, reduction of ON voltage by approximately 0.17V becomes possible.

Preferably, the amount of voltage drop caused by resistive layer 24 is adjusted to become smaller than the built-in voltage of the pn junction between p base region 2 and n emitter region 3. The latch-up can be avoided accordingly.

Referring to FIG. 12 next, a method of manufacturing IGBT according to the second embodiment is described. FIG. 12 is a cross sectional view showing a characteristic process of manufacturing IGBT according to the second embodiment.

Referring to FIG. 12, the IGBT is completed up to gate electrode 6 through steps similar to those according to the first embodiment. Insulating layer 7 is formed by the method similar to that of the first embodiment, and dielectric layer 7 is patterned to a prescribed shape. At this time, the entire surface of p base region 2 not covered with gate electrode 6 is exposed.

After a polysilicon layer doped with phosphorus is deposited on the first main surface 14a utilizing the CVD or the like, the polysilicon layer is patterned to have a prescribed shaped. Resistive layer 24 is formed to extend from a portion on p base region 2 onto a part of the surface of n emitter region 3. Metal electrode layer 8 is thereafter formed to cover resistive layer 24 and n emitter region 3. Other components are thereafter formed by steps similar to those according to the first embodiment, and the IGBT shown in FIG. 11 is completed.

(Third Embodiment)

Figure 13:
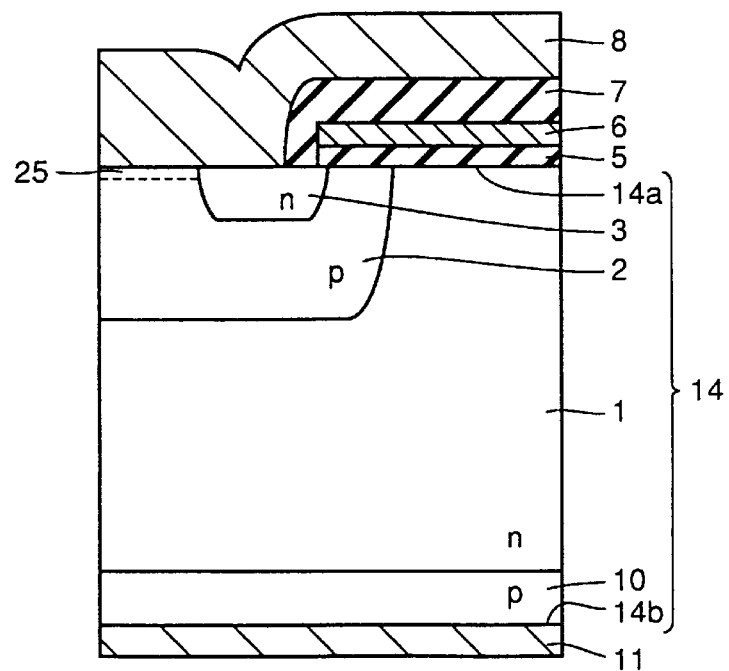
FIG. 13 is a cross sectional view showing an n channel IGBT having a planar gate structure according to the third embodiment.
Figure 14:
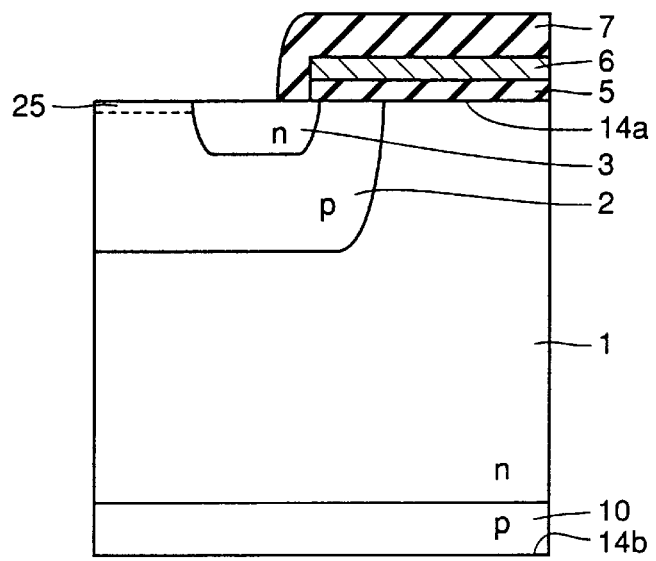
FIG. 14 is a cross section of IGBT shown in FIG. 13 illustrating a characteristic manufacturing process.
Figure 15:
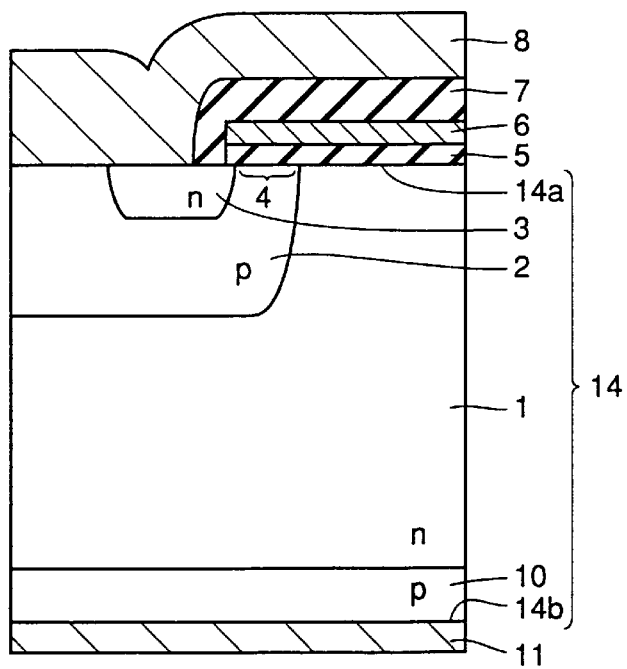
FIG. 15 is a cross section of an n channel IGBT having a conventional planar gate structure provided as one example.
Figure 16:
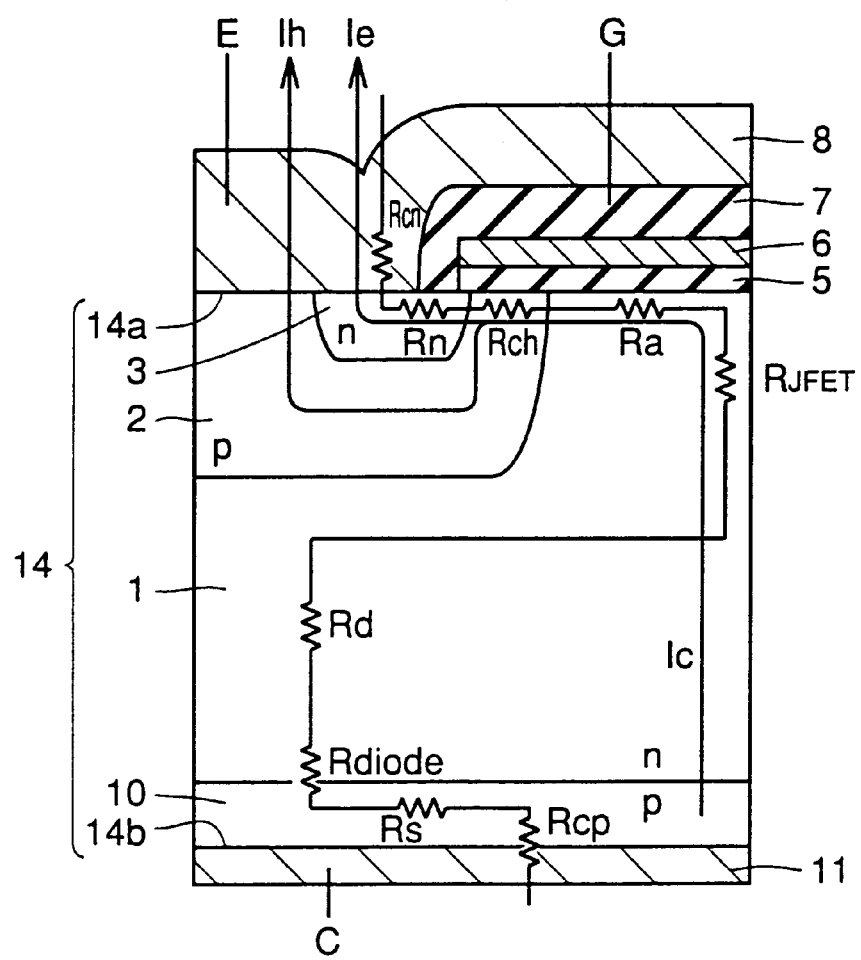
FIG. 16 shows a current path of IGBT shown in FIG. 15.

Referring to FIGS. 13 and 14, the third embodiment of the invention is described. FIG. 13 is a cross sectional view showing IGBT according to the third embodiment.

With reference to FIG. 13, according to the third embodiment, a Schottky junction region 25 is formed at the surface of p base region 2. Schottky junction region 25 can be formed by, for example, setting the concentration of impurities in p base region 2 at a contact portion between metal electrode layer 8 and p base region 2 at a lower value. Since n emitter region 3 contains n type impurities of high concentration (e.g. $10^{19} cm^{-3}$ or more), n emitter region 3 can be in ohmic contact with metal electrode layer 8. However, an energy barrier can be provided at the contact portion between metal electrode layer 8 and p base region 2 by setting the concentration of p type impurities at the contact portion between p base region 2 and the metal electrode layer 8 at a low value. As a result, the Schottky junction between p base region 2 and metal electrode layer 8 becomes possible.

A material which produces an energy barrier to an n type impurity region sufficiently lower than an energy barrier to a p type impurity region may be selected as a material for metal electrode layer 8. An energy barrier between p base region 2 and metal electrode layer 8 can be made higher than that between metal electrode layer 8 and n emitter region 3, and Schottky junction region 25 can be formed as the case described above.

Different materials for the electrode can be employed for n emitter region 3 and p base region 2. Specifically, as shown in FIG. 1, the first metal electrode layer 8a and the second metal electrode layer 8b may be formed of different materials. In this case, a material which produces an energy barrier to n emitter region 3 which is as low as possible is selected as a material for the second metal electrode layer 8b, and a material which produces an energy barrier to p base region 2 higher than that produced by the second metal electrode layer 8b is employed as a material for the first metal electrode layer 8a. Schottky junction region 25 can thus be produced. Those principles described above may be combined appropriately.

By providing Schottky junction region 25, voltage drop is possible in Schottky junction region 25 as in the case according to the second embodiment, and ON voltage of IGBT can be reduced. Preferably, the potential difference between p base region 2 and n emitter region 3 due to Schottky junction region 25 is smaller than the built-in voltage of the pn junction between p base region 2 and n emitter region 3 in the third embodiment as in the second embodiment. The latch-up can thus be prevented.

Referring to FIG. 14, a method of manufacturing IGBT according to the third embodiment is described. FIG. 14 is a cross section of IGBT showing a characteristic manufacturing step according to the third embodiment.

With reference to FIG. 14, IGBT is completed up to dielectric layer 7 through steps similar to those according to the second embodiment. Schottky junction region 25 is formed at the surface of p base region 2. Schottky junction region 25 can be formed by, for example, setting the concentration of p type impurities contained in the surface of p base region 2 at a low value by controlling the concentration in the surface of p base region 2. Specifically, an amount of doping of p type impurities for the contact with metal electrode layer 8 is controlled or the doping is omitted. IGBT shown in FIG. 13 is thereafter completed through steps similar to those according to the second embodiment.

The present invention can be applied to a device in which n type is replaced with p type in each embodiment. The first to the third embodiments can be combined appropriately.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a structure in which first and second main surfaces opposite to each other are provided and current flowing between said first and second main surfaces are conducted/shut off, comprising:

a semiconductor substrate having said first and second main surfaces;

a first impurity region of a first conductivity type formed to extend from said first main surface into said semiconductor substrate;

a second impurity region of a second conductivity type formed to extend from said first main surface into said first impurity region;

a third impurity region of the first conductivity type formed to extend from said first main surface into said second impurity region;

a channel formation region located in said second impurity region and reaches said first main surface;

a gate dielectric layer formed on said first main surface to cover said channel formation region;

a gate electrode having a portion opposite to said channel formation region with said gate dielectric layer therebetween;

forward bias means for applying forward bias to a pn junction between said second and third impurity regions during conduction; and a fourth impurity region of the second conductivity type formed to extend from said second main surface into said semiconductor substrate.

2. The semiconductor device according to claim 1, wherein voltage applied to the pn junction between said second and third impurity regions by said forward bias means is smaller than built-in voltage of said pn junction.

3. The semiconductor device according to claim 1, further comprising:

a first electrode layer formed on the first main surface of said semiconductor substrate to be electrically connected with said second impurity region;

a second electrode layer formed on the first main surface of said semiconductor substrate to be electrically connected with said third impurity region;

a direct current power supply as said forward bias means electrically connected with said first and second electrode layers for keeping a potential of said second impurity region relatively higher than a potential of said third impurity region; and a third electrode layer formed on said second main surface to be electrically connected with said fourth impurity region.

4. The semiconductor device according to claim 3, wherein said first electrode layer is constituted by a metal layer formed to be in ohmic contact with a surface of said second impurity region, said second electrode layer is constituted by a metal layer formed to be in ohmic contact with a surface of said third impurity region, and a dielectric layer is formed between said first and second electrode layers to extend from a portion on said first main surface.

5. The semiconductor device according to claim 1, further comprising:

a first electrode layer formed on said first main surface to be electrically connected with said second impurity region;

voltage drop means provided as said forward bias means between said first electrode layer and said second impurity region; and a second electrode layer formed on said second main surface to be electrically connected with said fourth impurity region.

6. The semiconductor device according to claim 5, including a resistive layer as said voltage drop means having a resistance value higher than a sheet resistance value of said second impurity region.

7. The semiconductor device according to claim 5, including a Schottky junction region as said voltage drop means formed between said second impurity region and said first electrode layer.

8. A method of manufacturing a semiconductor device having a structure in which first and second main surfaces opposite to each other are provided and current flowing between said first and second main surfaces is conducted/shut off, comprising the steps of:

providing a semiconductor substrate having said first and second main surfaces;

forming a first impurity region of a first conductivity type to extend from said first main surface into said semiconductor substrate;

forming a second impurity region of a second conductivity type to extend from said first main surface into said first impurity region;

forming a third impurity region of the first conductivity type to extend from said first main surface into said second impurity region;

forming a fourth impurity region of the second conductivity type to extend from said second main surface into said semiconductor substrate;

forming a gate dielectric layer to cover a channel formation region which is located in said second impurity region and which reaches said first main surface;

forming a gate electrode having a portion opposite to said channel formation region with said gate dielectric layer therebetween;

forming a first electrode layer on said first main surface to be electrically connected with said second impurity region;

exposing a surface of said third impurity region by patterning said first electrode layer;

forming a dielectric layer to cover said patterned first electrode layer;

forming a second electrode layer on both of said dielectric layer and the surface of said third impurity region;

forming a third electrode layer on a surface of said fourth impurity region; and placing a direct current power supply unit to be electrically connected with said first and second electrode layers.

9. A method of manufacturing a semiconductor device having a structure in which first and second main surfaces opposite to each other are provided and current flowing between said first and second main surfaces is conducted/shut off, comprising the steps of:

providing a semiconductor substrate having said first and second main surfaces;

forming a first impurity region of a first conductivity type to extend from said first main surface into said semiconductor substrate;

forming a second impurity region of a second conductivity type to extend from said first main surface into said first impurity region;

forming a third impurity region of the first conductivity type to extend from said first main surface into said second impurity region;

forming a fourth impurity region of the second conductivity type to extend from said second main surface into said semiconductor substrate;

forming a gate dielectric layer to cover a channel formation region which is located in said second impurity region and which reaches said first main surface;

forming a gate electrode having a portion opposite to said channel formation region with said gate dielectric layer therebetween;

forming a voltage drop portion for generating voltage drop at a surface of said second impurity region;

forming a first electrode layer to extend from a portion on a surface of said third impurity region onto said voltage drop portion; and forming a second electrode layer on a surface of said fourth impurity region.

* * * * *